(12) United States Patent
Lenssen et al.

(10) Patent No.: US 6,501,271 B1
(45) Date of Patent: Dec. 31, 2002

(54) ROBUST GIANT MAGNETORESISTIVE EFFECT TYPE MULTILAYER SENSOR

(75) Inventors: Kars-Michiel H. Lenssen, Eindhoven (NL); Antonius E. T. Kuiper, Eindhoven (NL); Freddy Roozeboom, Eindhoven (NL)

(73) Assignee: Koninkiljke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/306,068

(22) Filed: May 6, 1999

(30) Foreign Application Priority Data

May 11, 1998 (EP) .............................. 98201457

(51) Int. Cl.[7] .............................................. G01R 33/09
(52) U.S. Cl. ...................................... 324/252; 428/900
(58) Field of Search ............................ 324/252, 207.21, 324/210, 212; 360/113; 338/32 R; 428/195, 692, 213, 900

(56) References Cited

U.S. PATENT DOCUMENTS

| | | | |
|---|---|---|---|
| 5,465,185 A | * 11/1995 | Heim et al. ................. | 360/113 |
| 5,686,837 A | 11/1997 | Coehoorn et al. .......... | 324/252 |
| 5,898,548 A | * 4/1999 | Dill et al. .................... | 360/113 |
| 5,933,297 A | * 8/1999 | Hoshiya et al. ............. | 360/113 |
| 6,057,049 A | * 5/2000 | Fuke et al. .................. | 428/700 |
| 6,137,662 A | * 10/2000 | Huai et al. ............. | 360/327.22 |
| 6,157,296 A1 | * 1/2001 | Tokunaga et al. ......... | 338/32 R |
| 6,204,071 B1 | * 3/2001 | Ju et al. ......................... | 438/3 |

FOREIGN PATENT DOCUMENTS

| | | | |
|---|---|---|---|
| EP | 0717422 A1 | 6/1996 | ........... H01F/10/08 |

* cited by examiner

*Primary Examiner*—Jay Patidar

(57) ABSTRACT

A robust Giant Magneto Resistive effect type multilayer sensor comprising a free and a pinned ferromagnetic layer, which can withstand high temperatures and strong magnetic fields as required in automotive applications. The GMR multi-layer has an asymmetric magneto-resistive curve and enables sensors with complementary output signals so that a Wheatstone bridge is possible. The improvement is obtained by a combination of measures including the use of a combination of an Artificial Anti Ferromagnet as the pinned layer and an IrMn exchange-biasing layer, the latter preferably arranged at the bottom of the layer stack on top of a buffer layer.

6 Claims, 3 Drawing Sheets

ROBUST GIANT MAGNETORESISTIVE EFFECT TYPE MULTILAYER SENSOR

BACKGROUND AND SUMMARY OF THE INVENTION

The invention relates to a magnetic multilayer sensor. The sensor may present a spin tunneling or a magnetoreresistive effect. Magnetoresistive sensors are known from U.S. Pat. No. 5,686,837.

Certain magnetoresistive sensors use the so-called GMR effect.

Giant magnetoresistance (GMR) is the phenomenon that the resistance of a material (e.g. a magnetic multilayer) depends on the angle between magnetization directions (e.g. of different layers). Examples of GMR material systems are exchange-biased spin valves and multilayers comprising artificial antiferromagnets (AAF's).

For automotive applications it is required that magnetic sensors also operate at high temperatures (up to 175° C.–200° C.). Moreover, the sensors should operate in a broad field range and may not be irreversibly affected in an even larger field range. At present no material system is available that can fulfil both of these requirements and has suitable magnetoresistance characteristics for practical sensors.

For example, the antiferromagnetically coupled multilayers of commercially available sensors could fulfil the requirements reasonably; however, the symmetric output curve complicates (e.g. with respect to full Wheatstone-bridge configurations) or even inhibits (e.g. analog angle sensor in saturation) many applications.

Exchange-biased spin valves show poor thermal stability or have a too small field range. On the other hand, AAF's are only stable up to limited magnetic fields. At higher magnetic fields the output characteristics can even be flipped, which is unacceptable because of safety matters. Therefore a different, robust method of fixing a magnetization direction is needed.

In order to eliminate output variations due to temperature changes often (Wheatstone-)bridge configurations are used. This requires MR-elements with opposite (signs of) output signals, which in principle could be accomplished if elements with opposite directions of the fixed magnetization could be made.

Thus it is an object of the present invention, in order to enable practical applications of GMR in field sensors, to provide a new material system that provides an unambiguous, asymmetric output signal in a broad temperature and magnetic field range.

The above object is met by a sensor which comprises a substrate which carries a free and a pinned ferromagnetic layer for presenting the magnetoresistive effect, said pinned layer comprising an artificial antiferromagnet layer system (AAF), and an exchange biasing layer of an IrMn type material, said exchange biasing layer being adjacent to and in contact with the AAF layer system.

By this multilayer system the following is achieved:
- the blocking temperature of IrMn is higher than that of FeMn and unlike NiMn no annealing treatment is needed. The blocking temperature is the temperature above which the exchange biasing between the antiferromagnetic IrMn type layer and the pinned layer vanishes (reduces to zero).
- the AAF diminishes magnetostatic coupling between the pinned and the free layer;
- the AAF provides a large rigidity in magnetic fields because of the very small net magnetic moment (theoretically zero in the ideal case), however it is stable in two opposite directions;
- in combination with the exchange-biasing layer this provides a very large magnetic field range (for comparison: in exchange-biased spin valves the exchange biasing field is typically at most 20–30 kA/m);
- by means of exchange-biasing an unambiguous curve is obtained;
- the exchange-biasing provides a way to set the direction of the pinned layers, which is required e.g. for Wheatstone-bridge configurations.

The AAF may comprise a Co/non-magnetic metal/Co system, but preferably CoFe/non-magnetic metal/CoFe is used, because in such systems an anisotropy can be induced.

The non-magnetic metal in the AAF preferably is Ru, which provides strong coupling and appears to be very stable (no oxidation, no diffusion) which is very important for the definition of the thinnest and most critical layer in the AAF stack.

To eliminate diffusion Ni preferably is avoided at all interfaces with Cu: CoFe is used instead of NiFe. Moreover, this increases the GMR ratio. Compared with Co, CoFe gives a lower coercivity (and better texture) in the free layer.

The exchange-biasing field is larger in inverted than in conventional spin valves; therefore the exchange-biasing layer is preferably positioned nearest to the substrate. However, in this case a buffer layer may be needed to obtain the required texture. Investigations showed that (2 nm) NiFe on (for example 3.5 nm) Ta is preferred.

These and other embodiments of the invention will be elucidated with reference to the drawing.

DETAILED DESCRIPTION

Figure 1:
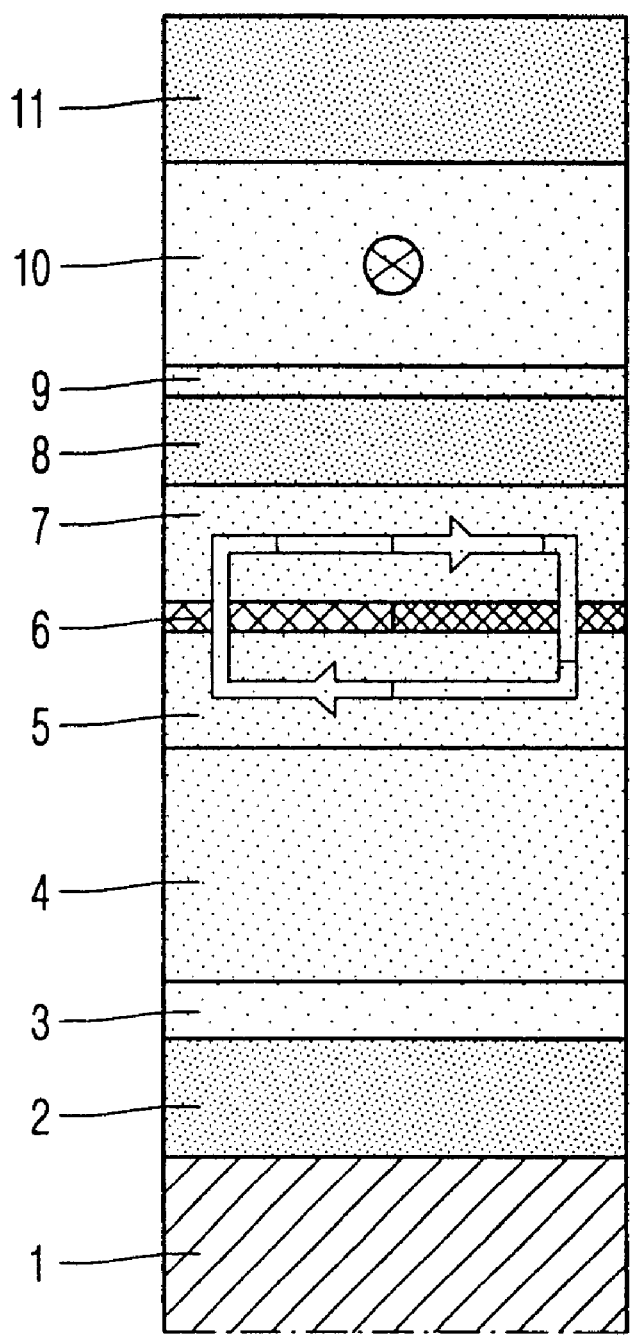
FIG. 1 shows a schematical cross-section through an embodiment of an inventive magnetoresistive sensor.

FIG. 1 shows a schematic composition of an embodiment of the inventive GMR multilayer stack. On a substrate 1 (e.g. glass, a semiconductor material like Si or a ceramic material, such as $Al_2O_3$), a bufferlayer to modify the crystallographic texture or grain size of the subsequent layer(s), if needed, is provided. If used, the buffer layer may comprise a first sublayer of Ta and a second sublayer of NiFe. On the bufferlayer 2, 3 an IrMn type exchange bias layer 4 (e.g. of 10 nm IrMn) is deposited. By IrMn type is meant IrMn or an alloy of IrMn with at least one further metal. On top of the bias layer 4 an artificial antiferromagnetic (AAF) stack is provided which comprises a first $Co_{90} Fe_{10}$ layer 5 (e.g. 4.0 nm thick), a Ru layer 6 (e.g. 0.8 nm thick) and a second $Co_{90} Fe_{10}$ layer 7 (e.g. 4.0 nm thick). On the AAF stack a non-magnetic spacer layer 8 is deposited. The material of the spacer layer can be a Cu-type material. By Cu-type is meant Cu (e.g. 2.5 nm thick Cu) or an alloy of Cu with a further metal, in particular Ag. On top of the spacer layer 8 a layer 9 of $Co_{90} Fe_{10}$ (e.g. 0.8 nm thick is provided which carries a $Ni_{80} Fe_{20}$ layer 10 (e.g. 5 nm thick). A protective layer 11 (e.g. of 4 nm Ta) covers the layer system.

Figure 2:
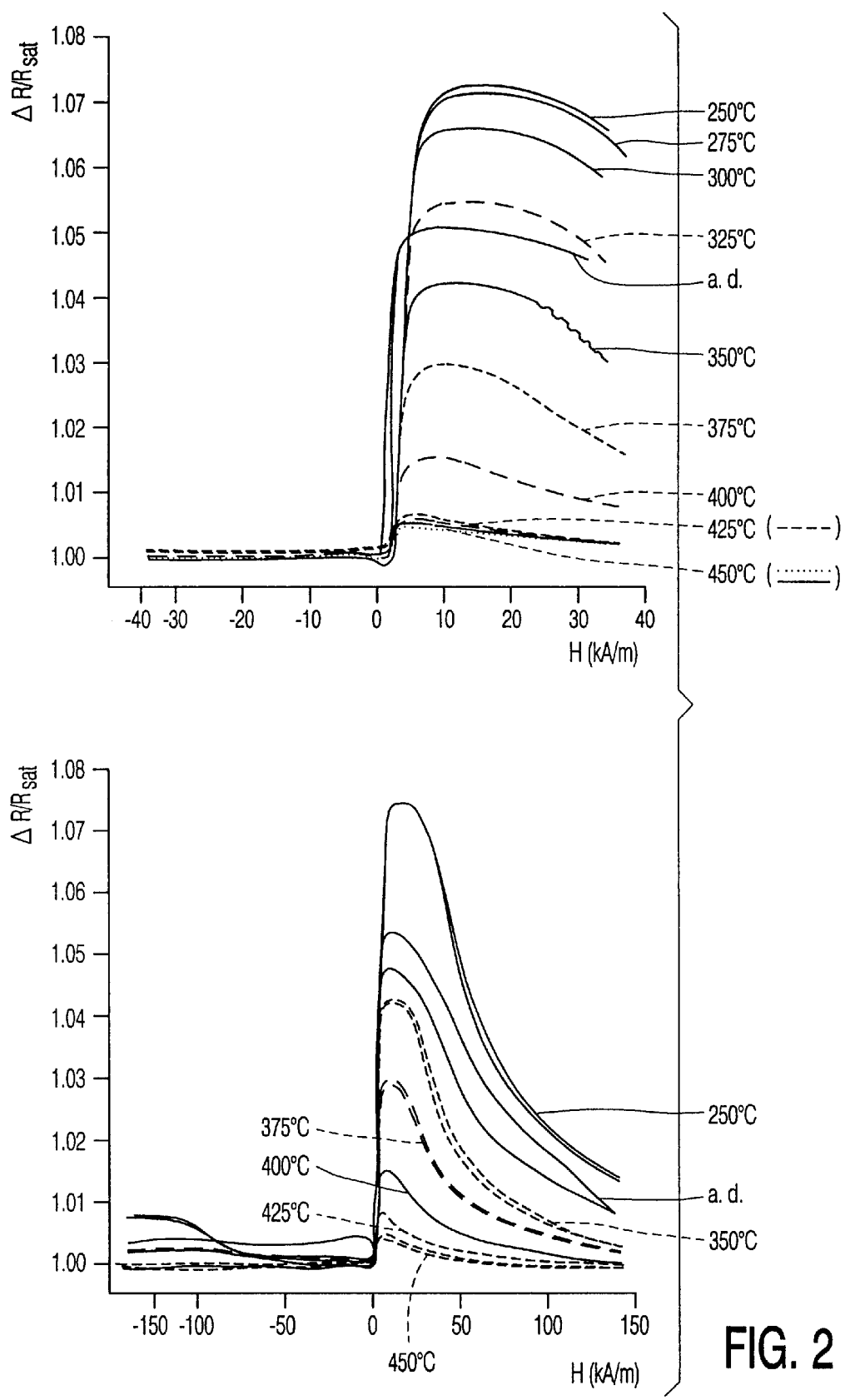
FIG. 2 shows magnetoresistance curves measures after annealing at different temperatures.

In order to test the temperature stability some experiments have been done. A similar sample as shown in FIG. 1 has been annealed in a $N_2/H_2$ atmosphere for one minute in a Rapid Thermal Processing machine, while a field was applied in the plan of the film perpendicular to the original exchange-biasing direction. RTP was chosen to limit possible diffusion processes. The sample was successively annealed at 250° C., 275° C., 300° C., 325° C., 350° C., 375° C., 400° C., 425° C., 450° C. After each anneal process the magnetoresistance curves were measured, both in a perpendicular and in a parallel magnetic field (with respect to the original exchange biasing direction). The measurements in a parallel field are shown in FIG. 2. The most remarkable result is.that the direction of the exchange biasing has not been rotated in spite of the high temperatures. Although the GMR effect was diminished after the last anneal treatment at 450° C., the exchange-biasing direction has not been changed. This seems to indicate that the exchange biasing is so stable that structural degeneration occurs before magnetic degeneration. The first anneal treatments are even seen to increase the GMR effect.

This important result could only be obtained by the combination of IrMn with an AAF. To illustrate this, a film with an IrMn spin valve without AAF was given the same annealing at 350° C. In this case the exchange-biasing direction of this spin valve was indeed found to have rotated over 90°.

Application Areas

Figure 3:
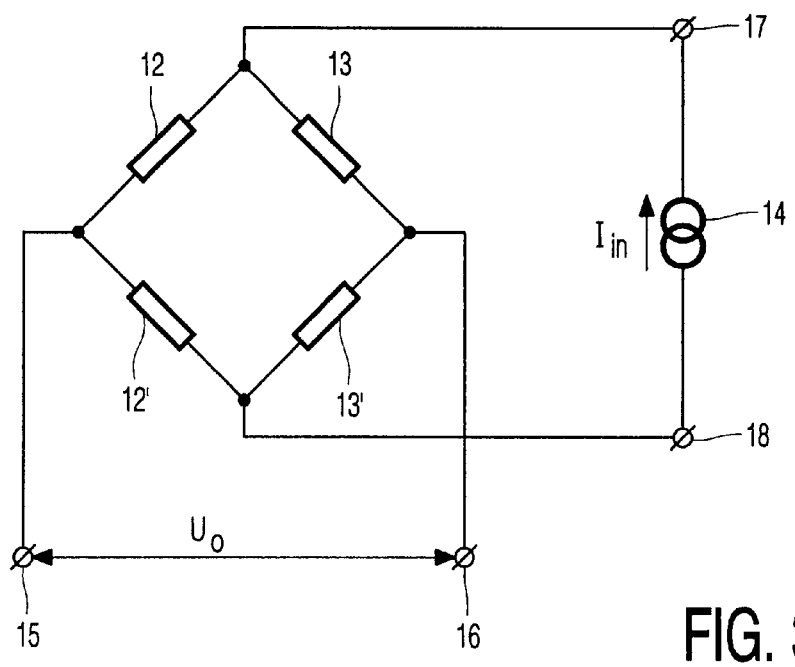
FIG. 3 shows a Wheatstone bridge.

The described material system may be widely used in GMR-sensors, in particular for automotive and industrial applications. Specific applications are digital position sensors (e.g. for crankshaft position) and analog angle sensors (e.g. valve position, pedal position, steering wheel position). As the inventive sensor has an asymmetric magnetoresistance curve, it enables sensors with complementary output signals, so that use in a Wheatstone bridge is possible (FIG. 3). Sensor elements which provide complementary output signals can be made by producing a first free/pinned layer system in which the (magnetic orientation of the) pinned layer is +90° with respect to the free layer and a second free/pinned layer system in which the (magnetic orientation of the) pinned layer is at −90° with the free layer. Orienting the pinned layer can be achieved by heating and cooling the layer in a magnetic field having the desired orientation. Such a method is described in U.S. Pat. No. 5,686,837 (PHN 14825).

FIG. 3 shows the equivalent diagram of a Wheatstone bridge, having magnetoresistive sensor elements 12, 12', 13, 13' in accordance with the invention, and a current source 14 for a current $I_{in}$ connected to the terminals 17 and 18. The output voltage $U_o$ is present across the terminals 15 and 16. The bridge can be operated by voltage control or current control. In comparison with voltage control, the current control shown here offers the advantage that a decrease of the output voltage $U_o$ in the event of an increasing temperature, due to a decrease of the relative magnetoresistive effect, is aptly compensated for by an increase of the absolute value of the magnetoresistive elements 12, 12', 13, 13' in the bridge which is caused by a positive temperature coefficient of the resistive material.

Figure 4:
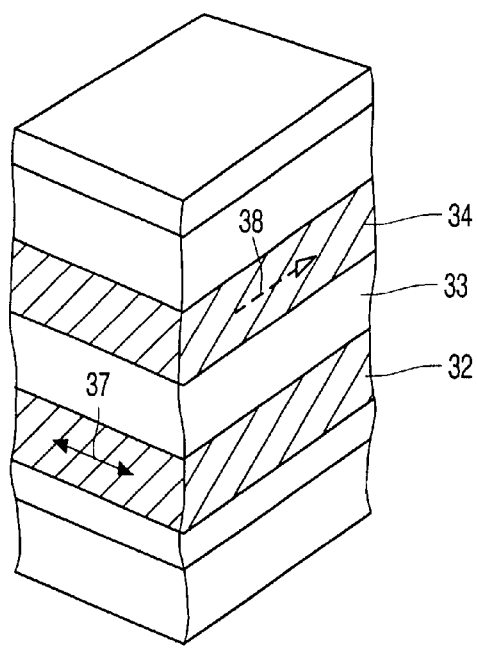
FIG. 4 shows a simplified view of a part of a magnetoresistive sensor element.
Figure 4:
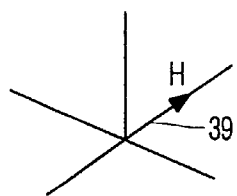

FIG. 4 shows the construction of a part of a magnetoresistive sensor element as can be used according to the invention.

Arrow 37 in FIG. 4 denotes the direction of the anisotropy of free ferromagnetic layer 32 and an arrow 38 denotes the direction of the effective anisotropy of pinned ferromagnetic layer 34. Layers 32 and 34 are separated by a non-ferromagnetic layer 33. An arrow 39 denotes the component of a magnetic field H to be measured which is directed parallel to the effective anisotropy of the second NiFe layer 34. In the magnetoresistive elements 12, 12', 13, 13' used in accordance with the invention the easy magnetization direction of the sensitive ferromagnetic material of the layer 32 extends substantially perpendicularly to the effective anisotropy of the ferromagnetic layer 34.

During the manufacture of the sensor elements the magnetization directions of the ferromagnetic layers (32 and 34) are laid down so that two elements in two adjacent branches of the bridge exhibit an opposed sensitivity to external magnetic fields. Moreover, in each magnetoresistive sensor element the magnetization of a ferromagnetic layer (32) is adjusted substantially perpendicularly to the magnetization direction of the other ferromagnetic layer (34). As a result of these steps it is achieved that auxiliary fields are no longer required for the measurement of small magnetic fields, that the sensor is substantially free of hysteresis and that it has an enhanced linearity.

The free layer may be a single CoFe layer, or a plurality of sublayers (e.g. CoFe+NiFe; CoFe+NiFe+CoFe, etc.) Instead of CoFe, Co of CoNiFe may be used, but if CoNiFe is used, it should preferably not be contiguous with the Cu spacer layer.

The AAF may comprise a plurality of ferromagnetic and non-magnetic layers. Each ferromagnetic layer may be composed as described with respect to the free layer.

The sensor may comprise a combination of two pinned ferromagnetic layers and a free ferromagnetic layer.

The inventive sensor can also be used as a data storage cell. An angle set between the magnetization directions of the free and the pinned layer is representive for e.g. a "0" or a "1". The data content can be read out by measuring the resistance of the memory "cell".

Summarizing the invention relates to a robust Giant Magneto Resistive effect type multilayer sensor comprising a free and a pinned ferromagnetic layer, which can withstand high temperatures and strong magnetic fields as required in automotive applications. The GMR multi-layer has an asymmetric magneto-resistive curve and enables sensors with complementary output signals so that a Wheatstone bridge is possible. The improvement is obtained by a combination of measures including the use of a combination of an Artificial Anti Ferromagnet as the pinned layer and an IrMn exchange-biasing layer, the latter preferably arranged at the bottom of the layer stack on top of a buffer layer.

What is claimed is:

1. Magnetic multilayer sensor, comprising a substrate which carries a free and a pinned ferromagnetic layer, said pinned layer comprising an artificial antiferromagnet layer system (AAF), and an exchange biasing layer of IrMn type material, said exchange biasing layer being adjacent to, and in contact with, the AAF layer system.

2. Sensor as claimed in claim 1, in which the AAF layer system comprises two CoFe layers and an intermediate non-magnetic layer.

3. Sensor as claimed in claim 1, in which the free and the pinned ferromagnetic layer are separated by a Cu-type layer, the Cu-layer on both sides being contiguous with a Co or CoFe layer.

4. Sensor as claimed in claim 1, in which an intermediate layer of the AAF is an Ru layer.

5. Sensor as claimed in claim 1, in which the exchange biasing layer is arranged between the substrate and the AAF stack.

6. A Wheatstone bridge comprising two sensors as claimed in claim 1, said two sensors arranged to provide mutually complementary output signals in operation.

* * * * *